United States Patent
Bauer et al.

(10) Patent No.: US 9,618,597 B2
(45) Date of Patent: Apr. 11, 2017

(54) METHOD AND MAGNETIC RESONANCE APPARATUS FOR AUTOMATED ANALYSIS OF THE RAW DATA OF A SPECTRUM

(71) Applicants: Christina Bauer, Buckenhof (DE); Martin Berger, Fuerth (DE); Thomas Blum, Neunkirchen am Brand (DE); Christian Schuster, Langenzenn (DE)

(72) Inventors: Christina Bauer, Buckenhof (DE); Martin Berger, Fuerth (DE); Thomas Blum, Neunkirchen am Brand (DE); Christian Schuster, Langenzenn (DE)

(73) Assignee: Siemens Aktiengesellschaft, Munich (DE)

( * ) Notice: Subject to any disclaimer, the term of this patent is extended or adjusted under 35 U.S.C. 154(b) by 646 days.

(21) Appl. No.: 14/146,868

(22) Filed: Jan. 3, 2014

(65) Prior Publication Data

US 2014/0191755 A1 Jul. 10, 2014

(30) Foreign Application Priority Data

Jan. 4, 2013 (DE) ........................ 10 2013 200 058

(51) Int. Cl.
*G01R 33/56* (2006.01)
*G01R 33/46* (2006.01)

(52) U.S. Cl.
CPC ..... *G01R 33/5608* (2013.01); *G01R 33/4625* (2013.01)

(58) Field of Classification Search
CPC .................. G01R 33/5608; G01R 33/4625
See application file for complete search history.

(56) References Cited

U.S. PATENT DOCUMENTS

| | | | |
|---|---|---|---|
| 2005/0107683 A1* | 5/2005 | Mountford | G01N 24/08 600/410 |
| 2006/0249668 A1 | 11/2006 | Goldberg et al. | |
| 2007/0221835 A1* | 9/2007 | Raftery | H01J 49/0036 250/282 |
| 2008/0240504 A1* | 10/2008 | Grosvenor | G06K 9/6256 382/103 |
| 2008/0289423 A1* | 11/2008 | Gordon | G01N 29/069 73/602 |
| 2009/0247860 A1* | 10/2009 | Djuric | G01N 24/08 600/420 |
| 2011/0028827 A1 | 2/2011 | Sitaram et al. | |
| 2011/0218948 A1* | 9/2011 | De Souza | G06F 15/16 706/12 |

(Continued)

OTHER PUBLICATIONS

Floeth et al. Multimodal Metabolic Imaging of Cerebral Gliomas: Positron Emission Tomography With Fluoroethyl-L-Tyrosine and Magnetic Resonance Spectroscopy, vol. 102 Feb. 2005, pp. 318-327.

(Continued)

*Primary Examiner* — Gregory H Curran
(74) *Attorney, Agent, or Firm* — Schiff Hardin LLP

(57) ABSTRACT

In a method and magnetic resonance apparatus for automating the analysis of MR raw data representing a spectrum, at least one post-processing procedure is applied to the raw data, so as to obtain a processed spectrum. The number of numerical values depicted by the processed spectrum is lowered to a feature vector. The feature vector is allocated to one of numerous groups of known feature vectors.

15 Claims, 1 Drawing Sheet

(56) References Cited

U.S. PATENT DOCUMENTS

2012/0119080 A1* 5/2012 Hazebroek .............. G06F 19/24
250/282

OTHER PUBLICATIONS

Lanfermann et al. Bedeutung Der H-MR-Spectroskopie Bei Der Differenzialdiagnose Und Graduierung Intrakranieller Tumoren, Deutches Arzeblatt vol. 10 (2004) pp. 649-655.

Fan et al. Classification of High-Resolution NMR Spectra Based on Complex Wavelet Domain Feature Selection and Kernel-Induced Random Forest, International Conference on Image and Signal Processing (ICISP10), see German O.A. (2010) p. 1-8.

Mahadevan et al. Feature Selection and Classification of Metabolomic Data Using Support Vector Machines, 10th International IFAC Symposium on Computer Applications in Biotechnology, vol. 1, (2007) pp. 39-44.

* cited by examiner

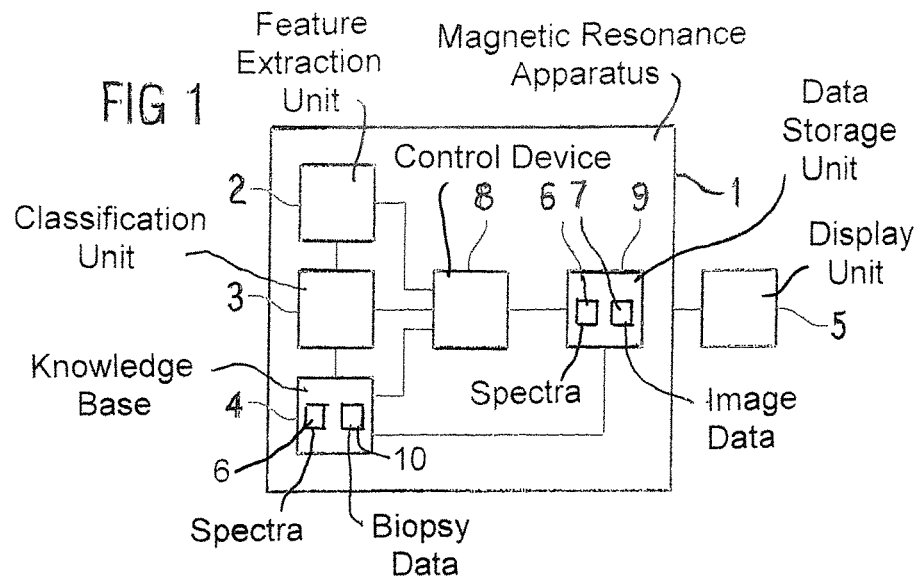
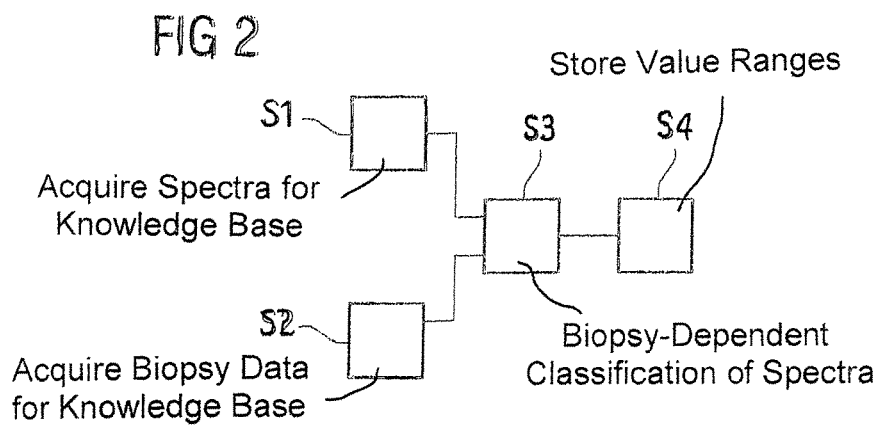
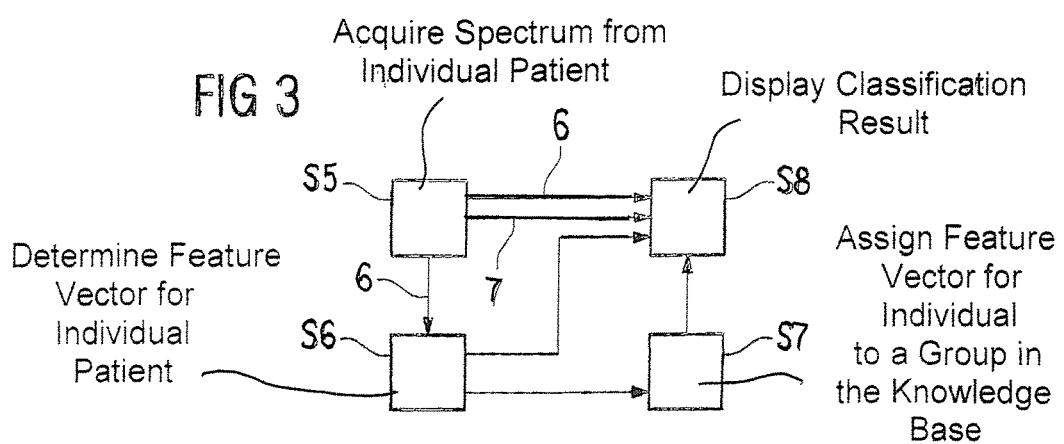

METHOD AND MAGNETIC RESONANCE APPARATUS FOR AUTOMATED ANALYSIS OF THE RAW DATA OF A SPECTRUM

BACKGROUND OF THE INVENTION

Field of the Invention

The present invention relates to a method and a magnetic resonance apparatus for the automated analysis of the raw data of a spectrum.

Description of the Prior Art

It is known that magnetic resonance spectra offer the possibility of examining metabolic processes in human bodies. Furthermore, the recording (detection or acquisition) of spectra, and in particular magnetic resonance spectra, from materials is known, in order to derive conclusions from these spectra regarding the aging state of the materials, for example.

For this purpose, either signal intensities for specific resonances are determined, or relative signal intensity ratios are formed. These signal intensities or relative signal intensity ratios are characteristic for a specific state of the object examined, because the signal intensity of a resonance correlates directly to the concentration of the material in question from which the resonance originates.

In order to determine such signal intensities, the area under the spectrum in a specific frequency range, specifically a so-called peak, is measured. The use of a single signal intensity is frequently not possible because the signal intensity is dependent on numerous factors, including the echo time, the repetition interval, the receiver gain, the measurement sequence used for the recording, and numerous other variables. For this reason, typically, signal intensity ratios for two resonances in a spectrum are compared with one another.

The signal intensities are typically analyzed by matching a known spectrum thereto.

Aside from the examination of materials, MR spectra are also used in order to examine metabolite concentrations or ratios in tissues of patients, because these concentrations are normally changed by illnesses or pathologies in a defined manner. It is known that, for example, in healthy brain tissue, the relative signal ratio of N-acetylaspartic acid (NAA) to creatine (KR in German) lies at 2.0, while in tumor tissue, it drops to values of less than 1.6. Before executing the diagnostics, the appropriate published values must first be obtained. The same applies, as a matter of course, for materials control or examination.

This results in either the same spectrum in numerous persons being analyzed leading to different results, or the analysis of one spectrum being extremely complex and time consuming. The analysis results thus exhibit a certain inherent uncertainty.

SUMMARY OF THE INVENTION

An object of the present invention is to provide a method and a magnetic resonance apparatus, that enable a simplified spectral analysis (analysis of spectra).

According to the invention, one or more post-processing procedures are applied to the raw data representing the spectrum, in a first step. These procedures serve to improve the ability to analyze the spectrum, and subsequently, shall represent the raw data of an MR spectrum.

Normally, a so-called free induction decay (FID) is present in the form of raw data. Post-processing procedures can already be carried out on these data. If the processed or unprocessed FID is subjected to a Fourier transformation, a spectrum is obtained. Post-processing procedures can also be applied to this spectrum.

One potential post-processing procedure is baseline correction. For this, for example, the average value for the last points of an FID is calculated, and this average value is deducted from each point in the FID. The baseline correction is thus one of the first post-processing procedures.

Furthermore, an apodization can be performed, in which the FID is multiplied with a weighting function. Among others, the Hann window and the Hamming window are known. By means of this weighting, depending on the weighting function, either the spectral resolution can be improved, or the signal-to-noise ratio (SNR) can be increased. Through the improvement of one of the two characteristics, the other is normally made worse; a simultaneous improvement of both characteristics by the use of a single weighting function is not possible.

In order to increase the resolution of the spectrum subjected to a Fourier transformation, in one design it is possible to expand the FID with zero values. One can thus expand the size of an FID from 128 data points to 256, 512 or 1024 data points, without having to record these data points. In the spectrum, this method, known as zero padding or zero filling, can be perceived as an interpolation.

The FID that has been subjected to a Fourier transformation can furthermore be subjected to a phase correction. For this, the phase of the complex value signal can be adjusted such that the real number portion only indicates pure absorptive signals.

In addition, the spectrum can be standardized (normalized).

Preferably, the suppression of a residual water resonance by means of Hankel Singular Value Decomposition (HSVD) can be applied, in particular, as the first post-processing procedure.

Subsequently, in one design, one or more frequency ranges can be selected. By means of this post-processing step, the computing time can be reduced in the following steps of the method according to the invention.

After executing some or all of the delineated, or other, post-processing procedures, a processed spectrum is obtained. In order to be able to carry out the comparison or classification of spectra, explained below, without error, the post-processing procedures that are carried out should remain the same.

In the next step of the method according to the invention, the number of numerical values depicting the spectrum is reduced, and normally modified thereby as well. This step is also known by the name "feature extraction." The fundamental concept is that a spectrum is already sufficiently characterized, for example, by the peaks determined for the (maximum) values.

However, in contrast to the introductory example regarding the definition of the NAA/KR ratio, reference is made not only to the maximum intensities or areas of certain peaks, but instead, statistical procedures are made use of for depicting the processed spectrum by means of a feature vector.

In the last step, the feature vector is assigned to one or more groups comprised of feature vectors. These known feature vectors are obtained from spectra in a learning phase, which are classified, evaluated or otherwise examined based on a gold standard. A classification of spectra thus occurs in the learning phase, which will be revealed through further examinations. With patients, the tissue, from which the signal is acquired, can be examined by means of a biopsy;

workpieces can be destroyed in order to analyze the interior thereof. The parameters for the classifier, by means of which the classification takes place, are estimated during the learning phase.

As a result, in addition to the recording of spectra, only progressive examinations take place in the learning phase. In particular, a diagnosis and classification of the removed tissue, or the workpiece, to a classification also occurs only in this phase. In executing the method according to the invention, only the similarity of a spectrum to previously recording spectra is established by means of the feature vectors.

In order to enable the classification of the spectra, a knowledge base is established in the learning phase. The spectra from the learning phase can be assigned to one or more characteristics, such as the sex or age of the patients, the region of the body being examined, or a specific illness. In the case of a tumor, types of tumors diagnosed in the biopsy, or the degree of malignancy, can be linked to the respective spectra, or feature vectors, respectively. In the case of material testing, the material can be assigned to a classification, such as "new," "younger than two years," "younger than five years," and "aged." The spectra analyzed in the learning phase can also be simultaneously grouped or classified with regard to numerous characteristics.

The classification of the currently measured spectrum can be absolute or with different probabilities. Thus, a spectrum can be classified with respect to WHO degrees of malignancy I-IV, depending on the probability, for example. This implies that the measured spectrum lies with a first probability in the group in which the feature vector lies having the characteristic "degree of malignancy I," with a second probability in the group "degree of malignancy II," etc. The analysis of these purely statistical numerical values occurs subsequently, and is no longer in the scope of the method according to the invention.

The raw data for the spectrum can be recorded, to particular advantage, using SVS or CSI procedures. Procedures of this type allow for a localization of the volume to be obtained from the signals. As a result, interference signals lying outside of the volume in question can be removed from the spectrum. In a materials test, the examination volume can be limited in this manner to the material that is to be examined, while the material surrounding the substance does not, by any means, contribute to the signal in the spectrum. With brain examinations, the examination volume is thus limited to the region of the tumor.

Preferably, the feature vector can be determined by binning. In a binning, a specific number of adjacent data points for the processed spectrum are compiled to form a new data point. If, for example, one takes eight data points, a spectrum having 128 data points is reduced to a feature vector having 16 elements.

Alternatively, the feature vector can be computed by an independent component analysis (ICA) or Sammon mapping. As a rule, any statistical procedure that enables a "feature extraction" can be used. The procedures listed explicitly above have been shown, however, to be particularly reliable.

Advantageously, the feature vector can be determined by a principal component analysis. For this, either the maximum values for the peaks, the upward-integrated areas of the peaks, or the spectrum as such, are referenced. The number of peaks or the signal intensity ratio determines the number of dimensions, starting from which the principal component analysis is initiated.

Preferably, the ratio of the signal intensity for an NAA peak to a creatine peak is used as the relative signal intensity ratio. Additionally, the ratio of the signal intensity for an NAA peak to a choline peak can be used as the relative signal intensity ratio. Furthermore, lipids, lactate or glutamine can be used to form a relative signal intensity ratio. These substances are also referred to collectively as metabolic products, or metabolites. The change to the respective signal intensities indicates, as explained above, a change in the metabolite concentrations.

The analysis of the relative signal intensities for the metabolites thus enables an assignment of a tumor to a specific type of tumor, or a classification in a degree of malignancy. Due to the automated classification of the spectrum, and thus the tumor, the reliability of the analysis of the spectrum is increased. As a matter of course, the automated classification of a spectrum does not replace a diagnosis; the purpose of the invention is to provide a suggestion for the assigning of the currently measured spectrum to a previously measured and classified group of spectra.

Aside from this, other possibilities exist for classifying a tumor. For example, a sample can be removed from the tumor tissue by means of a biopsy, as described above, which is then examined by pathological means. This method allows for a 100% reliable determination of the tumor type, as well as the degree of malignancy. A biopsy, however, is invasive, for which reason it is desirable to replace it by means of a non-invasive procedure.

To particular advantage, the classification of the feature vector can be computed using a linear classifier, in particular a Support Vector Machine (SVM). A Support Vector Machine separates a quantity of learning data into groups, such that the spacing of the respective feature vectors, which lie closest to the respective dividing line, or dividing plane, is maximized. As a result, a later classification of the feature vectors from unknown groupings is improved.

Instead of a linear Support Vector Machine, other linear classifiers, such as LDA (linear discriminant analysis) based classifiers may be used.

Alternatively, the classification of the feature vector can be computed using a non-linear classifier, in particular a Support Vector Machine with an RBF (Radial Basis Function) kernel. Other possible non-linear classifiers are the quadratic discriminant analysis (QDA) or random forest classifier (RFC).

In any case, the results of the pattern recognition and the classification are to be subjected to a control. The main advantage of the method according to the invention lies in the provision of a reproducible assignment to previously classified spectra, or the feature vectors thereof.

The invention also encompasses a magnetic resonance apparatus that has an MR data acquisition unit operated by a control unit. The apparatus also has a feature extraction unit and a classification unit. The feature extraction unit and the classification unit are preferably, be designed as computer program products that use a processed spectrum as the input value, and from this assign a classification to the spectrum.

The implementation of the method specified above in the control device can be carried out thereby in the form of a software.

The aforementioned embodiments of the method according to the invention correspond to appropriate designs for the magnetic resonance apparatus according to the invention.

BRIEF DESCRIPTION OF THE DRAWINGS

FIG. 1 schematically illustrates a magnetic resonance apparatus according to the invention.

FIG. 2 is a flowchart for accumulating a knowledge base.

FIG. 3 is a flowchart for the method according to the invention.

DESCRIPTION OF THE PREFERRED EMBODIMENTS

FIG. 1 shows, schematically, a magnetic resonance apparatus 1 according to the invention. The apparatus has a feature extraction unit 2, a classification unit 3 and a knowledge base 4. A display unit 5 is provided for displaying the spectra 6, image data 7, etc.

The feature extraction unit 2 and the classification unit 3 can be independent devices, but they can also be implemented as computer program products on a control device 8 for the magnetic resonance apparatus 1.

Furthermore, the magnetic resonance apparatus 1 has a data storage unit 9 for storing the spectra 6 and the image data 7. Additionally, the data storage unit 9 also contains the knowledge base 4. This can be designed as a simple data file or as a data base. As described below, the knowledge base 4 contains the spectra 6 as well as biopsy data 10.

In an alternative design, the knowledge base 4 is located on a server that is accessible through the internet, or another network, to which the control devices of numerous magnetic resonance apparatuses have access. By this arrangement, the up-dating of the data is simplified. In the formation of the knowledge base 4 as an independent system, it is, as a matter of course, advantageous if numerous users contribute to the accumulation of the data base, by means of which the quantity of data increases quickly.

FIG. 2 shows a flowchart for acquiring a knowledge base. In a first embodiment example, a knowledge or data base for classifying brain tumors by means of 1H magnetic resonance spectra is created. For this, proton spectra from the brain are recorded in step S1 from a number of samples, this number being 500, by way of example. The signals from which the spectra are generated, are limited to the region of the tissue that is to be examined, thus, in particular, the potential tumor. Therefore, an SVS (Single Voxel Spectroscopy) or CSI (Chemical Shift Imaging) measurement is executed as the recording procedure.

After recording the magnetic resonance spectra, a biopsy is also carried out on each patient (step S2). Although a biopsy is an invasive operation, it does, however, represent the gold standard, because it is possible to determine a type of tumor and/or the degree of malignancy with the lowest error rate by means of a biopsy. For a reliable improvement of the knowledge base 4, medically necessary interventions are therefore made use of, in order to classify the spectra.

In step S3, each spectrum 6 of the knowledge base is assigned precisely to a classification or group, respectively, obtained by means of the biopsy. Aside from the determined or known diseases, these can also be, for example, the sex, the age, the characteristic "smoker/non-smoker" and/or "alcoholic/non-alcoholic," etc. It is also possible, to assign a spectrum, or the corresponding feature vector, respectively, to numerous groupings, which can be retrieved depending on the problem being addressed. For this, one grouping for each spectrum exists in each knowledge base.

The following table is known from Lanfermann, H. et al., Meaning of the 1H spectroscopy in the differential diagnosis and grading of intracranial tumors. "Deutsches Ärzteblatt" [German Physicians' sheet], booklet 10 (2004), 649-655.

|  | Cho | Kr | NAA | Lac | Lip | AS |
| --- | --- | --- | --- | --- | --- | --- |
| Astrocytoma I-II | + | – | – | 0 | 0 | 0 |
| Astrocytoma III | ++ | –– | –– | + | 0 | 0 |
| Astrocytoma IV | +++ | ––– | ––– | + | + | 0 |
| Metastasis | ++ | ––– | ––– | + | ++ | 0 |
| Abscess | – | –– | ––– | + | + | ++ |

This shows the change in different metabolite concentrations (Cho: choline, Kr: creatine, NAA: N-acetylaspartic acid, Lac: Lactate, Lip: lipids, AS: amino acids) in comparison to healthy brain tissue. The first line shows, for example, that with astrocytoma of the grades I and II, the concentration of NAA in is reduced in comparison to healthy brain tissue, indicated by the minus sign, while the concentration of choline increases, indicated by the plus sign. Consequently, the relative signal intensity ratio of NAA to choline also sinks. This ratio continues to sink as the degree of malignancy increases.

The tables only show tendencies. In order to improve the knowledge base, however, it is necessary to record concrete numerical values and value ranges. These concrete numerical values can be reproducibly determined using a pattern recognition procedure. The value ranges determined by this means are stored in the knowledge base 4 (step S4).

The knowledge base 4 can be designed as a data file or as a data base.

FIG. 3 shows the classification of a recorded spectrum. At least one magnetic resonance spectrum is recorded with the magnetic resonance apparatus 1, but one or more image data sets can also be acquired (step S5).

In step S6, the processed spectrum is transmitted to the feature extraction unit 2. The feature extraction unit 2 establishes a feature vector from the spectrum.

The feature vector established by means of the feature extraction unit 2 is then sent to the classification unit 3. The classification unit 3 determines the assignment of the feature vector to a group in the knowledge base 4 (step S7).

Subsequently, the classification results and the spectrum, and likewise, images recorded with the magnetic resonance apparatus 1, are displayed on a display unit 5 (Step S8). A physician can then make a diagnosis based on these data.

The classification of a spectrum with a medical background is purely exemplary. The method according to the invention can be used anywhere where a reproducible classification is required. Further applications are, for example, as described above, materials control, and food chemistry.

Although modifications and changes may be suggested by those skilled in the art, it is the intention of the inventor to embody within the patent warranted hereon all changes and modifications as reasonably and properly come within the scope of his contribution to the art.

We claim as our invention:

1. A computerized method for automated analysis of raw data representing a spectrum acquired from an individual patient, said method comprising:

providing said raw data representing a spectrum acquired from an individual patient to a processor and, in said processor, applying at least one post-processing procedure to said raw data, thereby obtaining a processed spectrum of said individual patient;

in said processor, generating a feature vector from numerical values of the processed spectrum of said individual patient;

in said processor, automatically allocating said feature vector to one group of a plurality of groups in said knowledge base, where said knowledge bases comprises training feature vectors of tissues classified according to in vitro measurement results of said tissues, with each of training feature vector of each tissue is generated from a processed spectrum from a training patient comprising said tissue; and in said processor, based on said one group to which said feature vector is allocated, identifying a material from which said spectrum of said individual patient originates and emitting an electronic signal at an output of said processor indicating said material.

2. A method as claimed in claim 1 comprising acquiring said raw data representing each spectrum as raw magnetic resonance data representing each spectrum.

3. A method as claimed in claim 2 comprising acquiring said raw magnetic resonance data as raw magnetic resonance data representing a proton spectrum.

4. A method as claimed in claim 1 comprising acquiring said raw data representing each spectrum by a data acquisition procedure selected from the group consisting of an SVS (Single Voxel Spectroscopy) measurement and a CSI (Chemical Shift Imaging) measurement.

5. A method as claimed in claim 1 comprising determining each feature vector by binning in said processor.

6. A method as claimed in claim 1 comprising determining each feature vector by executing a principal component analysis in said processor.

7. A method as claimed in claim 1 comprising determining each feature vector by executing a procedure in said processor selected from the group consisting of an independency analysis and a Sammon mapping.

8. A method as claimed in claim 1 comprising allocating said feature vector of said individual patient to said one of said groups using a linear classifier.

9. A method as claimed in claim 8 comprising, in said processor, using a support vector machine as said linear classifier.

10. A method as claimed in claim 1 comprising allocating said feature vector of said individual patient to said one of said groups using a non-linear classifier.

11. A method as claimed in claim 10 comprising using a support vector machine with an RBF (Radial Basis Function) kernel in said processor as said non-linear classifier.

12. A method as claimed in claim 1 comprising, for the raw data representing each spectrum implementing a water suppression using a Hankel singular value decomposition in said processor, before determining the feature vector for that respective spectrum.

13. A method as claimed in claim 1, said method further comprising:

acquiring raw data representing a spectrum of a selected region of each of a plurality of patients in a patient population, and also acquiring an in vitro measurement from the selected region of each patient in said patient population;

providing said raw data, and an electronic designation of said in vitro measurement, for each patient in said patient population to a processor;

in said processor, generating a feature vector for each spectrum from numerical values of that respective spectrum represented by the raw data thereof, and storing said feature vectors and said in vitro measurements in a memory of said processor, and thereby forming a knowledge base in said memory; and in a training phase for said knowledge base, classifying, in said processor, the respective feature vectors of the spectra in said knowledge base into a plurality of groups dependent on said biopsy samples in said knowledge base.

14. A method as claimed in claim 1 wherein said in vitro measurement result is a biopsy sample.

15. A magnetic resonance apparatus comprising:

a control unit configured to operate said magnetic resonance apparatus to acquire raw MR data representing a spectrum in an individual patient situated in the apparatus;

a computerized processor supplied with said raw MR data, said computerized processor being configured to apply at least one post-processing procedure to said raw MR data, thereby obtaining a processed spectrum of said individual patient;

said processor being configured to generate a feature vector from numerical values of the processed spectrum to a feature vector;

said computerized processor being configured to allocate said feature vector to one group among a plurality of groups in said knowledge base, where said knowledge bases comprises training feature vectors of tissues classified according to in vitro measurement results of said tissues, with each of training feature vector of each tissue is generated from a processed spectrum from a training patient comprising said tissue; and said computerized processor being configured to identify said material, based on said one group to which said feature vector is allocated, and to emit an electronic signal at an output of said computerized processor indicating said material.

* * * * *